(12) United States Patent
Pavao-Moreira et al.

(10) Patent No.: US 9,407,199 B2
(45) Date of Patent: Aug. 2, 2016

(54) INTEGRATED CIRCUIT COMPRISING A FREQUENCY DEPENDENT CIRCUIT, WIRELESS DEVICE AND METHOD OF ADJUSTING A FREQUENCY

(71) Applicants: Cristian Pavao-Moreira, Frouzins (FR); Birama Goumballa, Larra (FR); Yi Yin, Munich (DE)

(72) Inventors: Cristian Pavao-Moreira, Frouzins (FR); Birama Goumballa, Larra (FR); Yi Yin, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/606,457

(22) Filed: Jan. 27, 2015

(65) Prior Publication Data

US 2016/0065131 A1    Mar. 3, 2016

(51) Int. Cl.
*H03B 5/12* (2006.01)
*H03B 5/24* (2006.01)

(52) U.S. Cl.
CPC ............ *H03B 5/24* (2013.01); *H03B 5/1243* (2013.01); *H03B 5/1265* (2013.01); *H03B 2200/005* (2013.01)

(58) Field of Classification Search
CPC .... H03B 5/124; H03B 5/1243; H03B 5/1265; H03B 2200/005
USPC .......... 331/36 C, 117 FE, 117 R, 167, 177 V
See application file for complete search history.

(56) References Cited

U.S. PATENT DOCUMENTS

| | | | |
|---|---|---|---|
| 5,648,744 A | 7/1997 | Prakash et al. | |
| 6,181,218 B1 * | 1/2001 | Clark | H03B 5/32 331/177 R |
| 6,774,736 B1 | 8/2004 | Kwek et al. | |
| 6,791,422 B2 | 9/2004 | Staszewski et al. | |
| 6,812,801 B2 * | 11/2004 | Korner | H03B 5/366 331/158 |
| 7,280,001 B2 * | 10/2007 | Maligeorgos | H03B 5/366 331/116 FE |
| 7,286,023 B2 * | 10/2007 | Tateyama | H03B 5/06 331/158 |
| 7,317,363 B2 * | 1/2008 | Kousai | H03L 7/181 331/117 FE |
| 7,463,097 B2 * | 12/2008 | Costa | H03L 1/026 331/14 |
| 7,474,159 B2 * | 1/2009 | Wang | H03L 7/099 331/16 |
| 7,772,929 B2 | 8/2010 | Da Dalt | |
| 7,782,152 B2 * | 8/2010 | Darabi | H03L 1/00 33/158 |

(Continued)

FOREIGN PATENT DOCUMENTS

EP    1901431 B1    3/2008
WO    2014006439 A1    1/2014

OTHER PUBLICATIONS

Lee, J. et al., "A Fully-Integrated 77-Ghz FMCW Radar Transceiver in 65-nm CMOS Technology," IEEE Journal of Solid-State Circuits, vol. 45 No. 12, Dec. 2010, 11 pages.

(Continued)

*Primary Examiner* — Levi Gannon
(74) *Attorney, Agent, or Firm* — Charlene R. Jacobsen

(57) ABSTRACT

An integrated circuit comprises a frequency dependent circuit comprising an input node, an output node and a main bank of selectable first capacitive elements that affect a frequency characteristic of the frequency dependent circuit. The frequency dependent circuit further comprises at least one shunt bank of selectable second capacitive elements located between ground and one of the input node or the output node, wherein at least one selectable second capacitive element switched out of the frequency dependent circuit is based on a number of the selectable first capacitive elements that are switched into the frequency dependent circuit.

16 Claims, 9 Drawing Sheets

(56) References Cited

U.S. PATENT DOCUMENTS

| | | | | |
|---|---|---|---|---|
| 7,902,933 | B1* | 3/2011 | Brennan | H03L 3/00 331/116 R |
| 7,982,551 | B2* | 7/2011 | Iwaida | H03L 1/023 331/117 FE |
| 8,130,046 | B2 | 3/2012 | Kwok | |
| 8,138,845 | B1* | 3/2012 | Zhang | H03B 5/1228 331/117 FE |
| 8,193,868 | B2 | 6/2012 | Trivedi | |
| 8,253,506 | B2* | 8/2012 | Liu | H03L 1/023 331/117 R |
| 8,508,308 | B2 | 8/2013 | Dong et al. | |
| 8,841,975 | B2* | 9/2014 | Nakamura | H03L 7/02 331/108 A |
| 2002/0033741 | A1 | 3/2002 | Craninckx et al. | |
| 2003/0227341 | A1* | 12/2003 | Sawada | H03B 5/1228 331/177 V |
| 2005/0062551 | A1* | 3/2005 | Coppola | H03L 7/099 331/36 C |
| 2005/0110589 | A1* | 5/2005 | Loke | H03L 7/07 331/177 V |
| 2006/0145776 | A1 | 7/2006 | Shi et al. | |
| 2006/0255865 | A1* | 11/2006 | Li | H03J 3/20 331/36 C |
| 2007/0132522 | A1* | 6/2007 | Lee | H03B 5/1228 331/167 |
| 2008/0238560 | A1* | 10/2008 | Shibata | H03B 5/1228 331/132 |
| 2014/0035691 | A1 | 2/2014 | Lamanna et al. | |
| 2014/0091864 | A1 | 4/2014 | Wang | |

OTHER PUBLICATIONS

Trotta, S. et al., "An RCP Packaged Transceiver Chipset for Automotive LRR and Systems in SiGe BiCMOS Technology," IEEE Transactions on Microwave Theory and Techniques, vol. 60 No. 3, Mar. 2012, 17 pages.

Mitomo, T. et al., "A 77 GHz 90nm CMOS Transceiver for FMCW Radar Applications," IEEE Journal of Solid-State Circuits, vol. 45, No. 4, Apr. 2010, 10 pages.

U.S. Appl. No. 14/606,492, filed Jan. 27, 2015, entitled "Method for Re-Centering a VCD, Integrated Circuit and Wireless Device".

Non-Final Office Action mailed Nov. 9, 2015 in U.S. Appl. No. 14/606,492; 14 Pages

* cited by examiner

FIG. 1 – Prior Art

INTEGRATED CIRCUIT COMPRISING A FREQUENCY DEPENDENT CIRCUIT, WIRELESS DEVICE AND METHOD OF ADJUSTING A FREQUENCY

CROSS REFERENCE TO RELATED APPLICATION(S)

The present application claims priority to International Application No. PCT/IB2014/001998, entitled "INTEGRATED CIRCUIT COMPRISING A FREQUENCY DEPENDENT CIRCUIT, WIRELESS DEVICE AND METHOD OF ADJUSTING A FREQUENCY," filed on Aug. 27, 2014, the entirety of which is herein incorporated by reference. The present application is related to co-pending U.S. patent application Ser. No. 14/606,492, entitled "METHOD FOR RE-CENTERING A VCO, INTEGRATED CIRCUIT AND WIRELESS DEVICE," filed on Jan. 27, 2015.

FIELD OF THE INVENTION

The field of this invention relates to an integrated circuit comprising a frequency dependent circuit, a wireless device and a method of adjusting a frequency.

BACKGROUND OF THE INVENTION

Automotive radar solutions for advanced driver assistance systems (ADAS) are currently being deployed on a large scale. These solutions can typically be grouped into long range radar (LRR) applications and short range radar (SRR) applications. Both of these applications generally use frequency modulated continuous wave (FMCW) modulation techniques in order to be able to identify a radar target, such as a car or a pedestrian.

These radar systems typically utilise millimeter wave (MMW) frequencies for transmission and reception. The frequency synthesisers, comprising voltage controlled oscillators (VCOs) that are responsible for the generation of the millimeter wave frequencies are important to the operation of the radar systems. Generally, voltage controlled oscillators operating at millimeter wave frequencies need to present a low phase noise, whilst providing a wide tuning range in order to cover the required modulation band (e.g. 1 GHz for LRR and 4 GHz for SRR).

Voltage controlled oscillators operating at millimeter wave frequencies generally suffer from centre frequency variation over extreme corners (process) and temperature conditions. Such centre frequency variations tend to reduce the available tuning range of these VCOs, which can limit the modulation bandwidth, thereby resulting in increased manufacturing yield losses.

In common VCO implementations, the output oscillation frequency is dependent upon capacitive, C, and inductive, L, element values within a resonator circuit. In most VCO designs, process and temperature variations shift the required oscillation frequency, $f_o$, to a different value, which may not be a desired or acceptable frequency.

A common technique to re-centre the VCO oscillation frequency is to change the value of a capacitive element within the resonator circuit, which in turn re-tunes the oscillation frequency of the resonator circuit.

Referring to FIG. 1, a known device described in WO2014/006439, having an LC oscillator circuit controlled by a full varactor based capacitive arrangement, is illustrated. The LC oscillator circuit 100 comprises a pair of cross-coupled PMOS transistors, M1/M2, 102 that provide a negative resistance to an LC circuit that comprises coils 105 and a full varactor-based arrangement, for generating the oscillation.

The full varactor-based arrangement is composed of a coarse varactor bank 120 with 1 to 'M' identical varactors driven by a thermometric set of control signals, and a fine varactor bank 130. In operation, 1 to 'M' varactors can be selected in order to obtain a given coarse frequency step, as required by the modulation scheme employed by the device.

The fine varactor bank 130 is a full varactor-based capacitive divider, and has a main varactor bank in parallel with two shunt varactor banks, further series connected to two series varactor banks. By switching one varactor unit of the main varactor bank at a time, an equivalent capacitance step is created between the differential output nodes of the VCO 100, thereby enabling a required frequency change to be achieved. The shunt and series varactor banks are both controllable, enabling a further tuning of the achievable frequency resolution.

However, such MOS-based solutions are not suited to MMW VCOs for radar applications, due primarily to limited VCO tuning range and too high VCO phase noise. MOS-based varactor devices also suffer from a limited operating supply voltage when compared to bipolar-based devices, for example, and typically present a higher 'off' capacitance. This higher 'off' capacitance can be a limitation at MMW frequencies, for example above 20 GHz, since a high 'off' capacitance can reduce VCO tuning range, and therefore the overall operating frequency of the whole synthesizer.

A further limitation of the device in FIG. 1 is the frequency resolution (i.e. frequency steps or unit capacitance steps) imposed by the circuit construction, which are not constant when several elements are switched 'on'.

Furthermore, MOS-based varactor devices generally present an intrinsically lower quality (Q) factor than, for example, bipolar-based varactor devices. This can make MOS-based varactor devices unsuitable for VCO systems that require stringent phase noise performance requirements, such as MMW radar applications.

In known VCO re-centering (tuning) operations, the traditional way to frequency (re-)tune in a phase locked loop (PLL) system is via band-selection, with the PLL locked in a closed loop mode of operation. However, as radar systems are FMCW based (where there is no concept of bands, channels, etc.), the VCO needs to be designed for a much wider tuning range than is required by the system. Thus far in such radar systems, as there has generally being a limited need for accuracy, the VCO re-centering (tuning) operation is performed in a closed loop mode of operation, with some coarse tuning of some capacitor banks located at the VCO tank.

SUMMARY OF THE INVENTION

The present invention provides an integrated circuit comprising a frequency dependent circuit, a wireless device and a method of adjusting a frequency as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

In examples herein described, the terms varactor and variable capacitive element and variable capacitor are used interchangeably, as would be appreciated by a skilled artisan.

The inventors have recognised and appreciated that the frequency resolution limitation of MOS-based varactor devices operating at MMW frequencies is not constant when several elements are enabled or disabled. The inventors have recognised and appreciated that this is in some part due to natural parasitic capacitance occurring when one or more varactor devices are enabled or disabled. At MMW frequencies, the additional parasitic capacitance caused by enabling the varactor devices cannot be ignored. In some example applications, this may be because a large parasitic capacitance can affect the frequency step linearity, thereby reducing the effectiveness of these devices at MMW frequencies. The natural parasitic capacitance generated by enabling varactor devices can be a particular problem if the parasitic capacitance has the same order of magnitude as other capacitances within the system.

Figure 1:
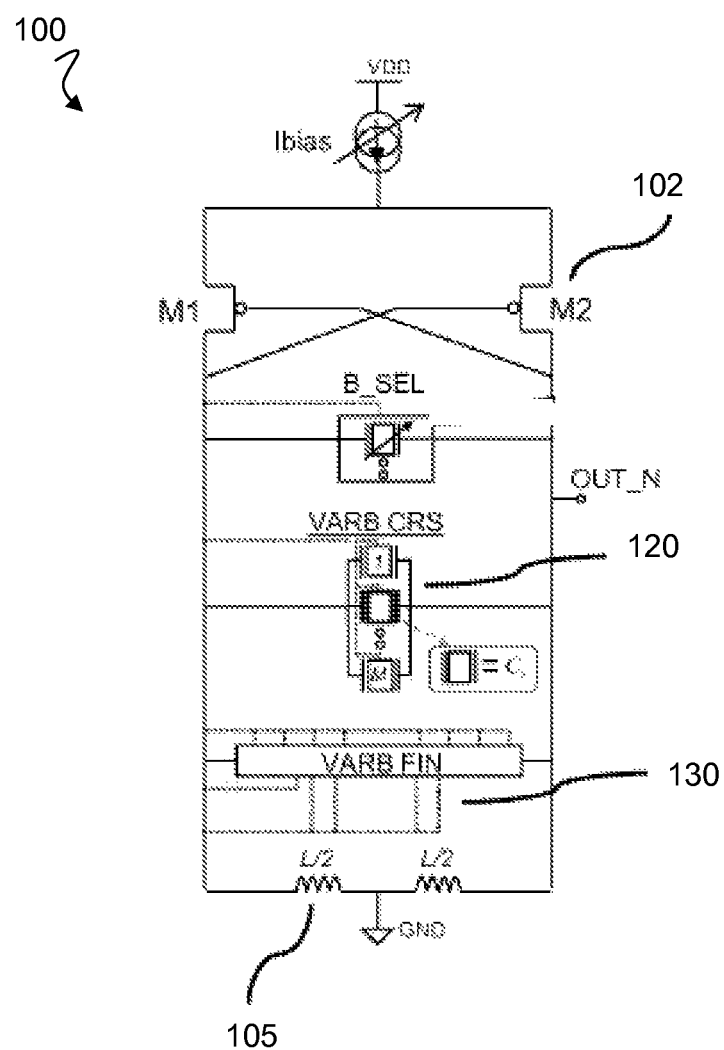
FIG. 1 schematically shows a known device having an LC oscillator circuit in which output frequency is controlled by a full varactor-based capacitive arrangement.
Figure 2:
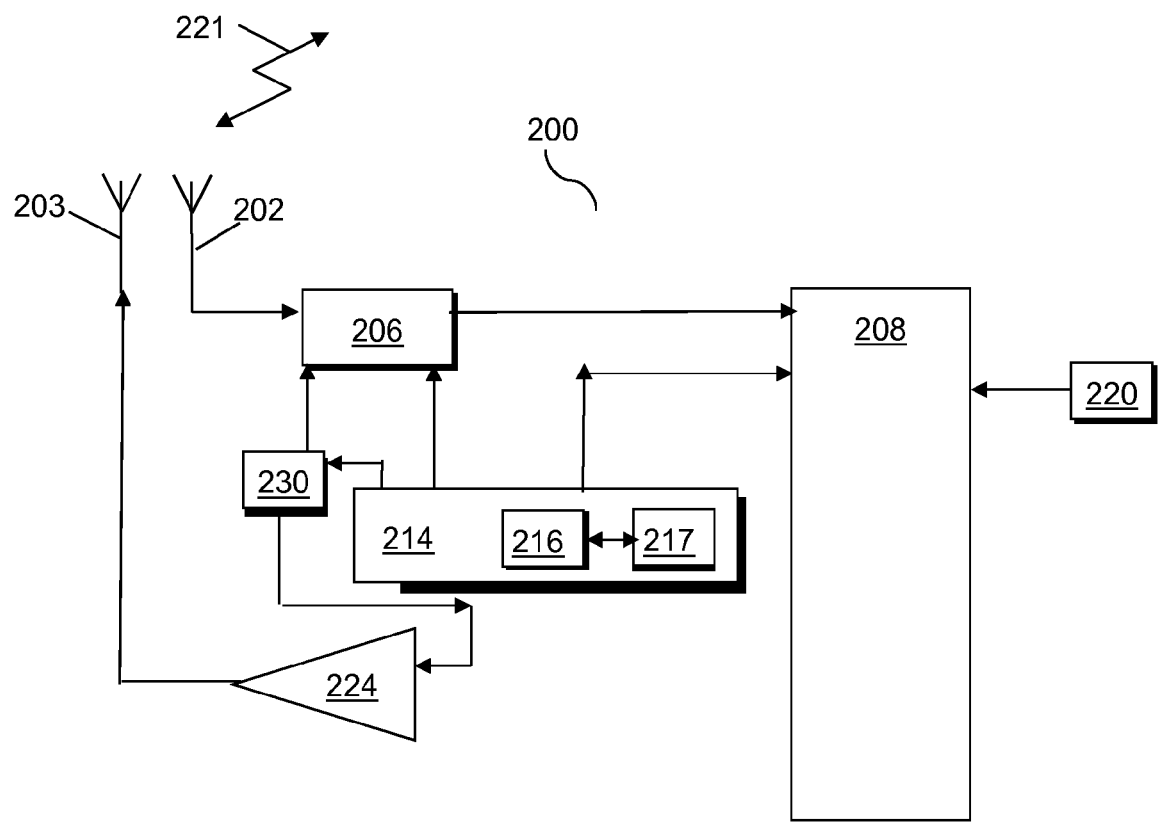
FIG. 2 illustrates an example block diagram of a wireless device.

Referring to FIG. 2, a block diagram of a wireless device, adapted in accordance with some examples, is shown. Purely for explanatory purposes, the wireless device is described in terms of a radar device 200 operating at MMW frequencies. The radar device 200 contains one or several antennas 202 for receiving transmissions 221, and one or several antennas 203 for the transmitter, with one shown for each for simplicity reasons only. The number of antennas 202, 203 used depends on the number of radar receiver and transmitter channels implemented in a given radar device. One or more receiver chains, as known in the art, include receiver front-end circuitry 206, effectively providing reception, frequency conversion, filtering and intermediate or base-band amplification, and finally an analog to digital conversion. In some examples, such circuits or components may reside in signal processing module 208, dependent upon the specific selected architecture. The receiver front-end circuitry 206 is coupled to a signal processing module 208 (generally realized by a digital signal processor (DSP)). A skilled artisan will appreciate that the level of integration of receiver circuits or components may be, in some instances, implementation-dependent.

The controller 214 maintains overall operational control of the radar device 200, and in some examples may comprise time-based digital functions (not shown) to control the timing of operations (e.g. transmission or reception of time-dependent signals, FMCW modulation generation, etc.) within the radar device 200. The controller 214 is also coupled to the receiver front-end circuitry 206 and the signal processing module 208. In some examples, the controller 214 is also coupled to a buffer module 217 and a memory device 216 that selectively stores operating regimes, such as decoding/encoding functions, and the like.

As regards the transmit chain, this essentially comprises a power amplifier 224 coupled to the transmitter antenna 203, antenna array, or plurality of antennas. The transmitter comprises the PA 224 and frequency generation circuit 230 that are both operationally responsive to the controller 214.

A single processor may be used to implement a processing of receive signals, as shown in FIG. 2. Clearly, the various components within the radar device 200 can be realized in discrete or integrated component form, with an ultimate structure therefore being an application-specific or design selection.

In radar device 200, radar transceiver topology is different from traditional wireless communication architectures (e.g. Bluetooth™, WiFi™, etc.), as modulation occurs within a phase locked loop (PLL) (typically via the fractional-N divider), and is applied directly to the PA 224. Therefore, in some examples, the receiver front-end circuitry 206 and transmitter PA 224 are operably coupled to a frequency generation circuit 230 that comprises a voltage controlled oscillator (VCO) circuit and PLL and fractional-N divider (not shown) arranged to provide local oscillator signals to down-convert modulated signals to a final intermediate or baseband frequency or digital signal.

Figure 3:
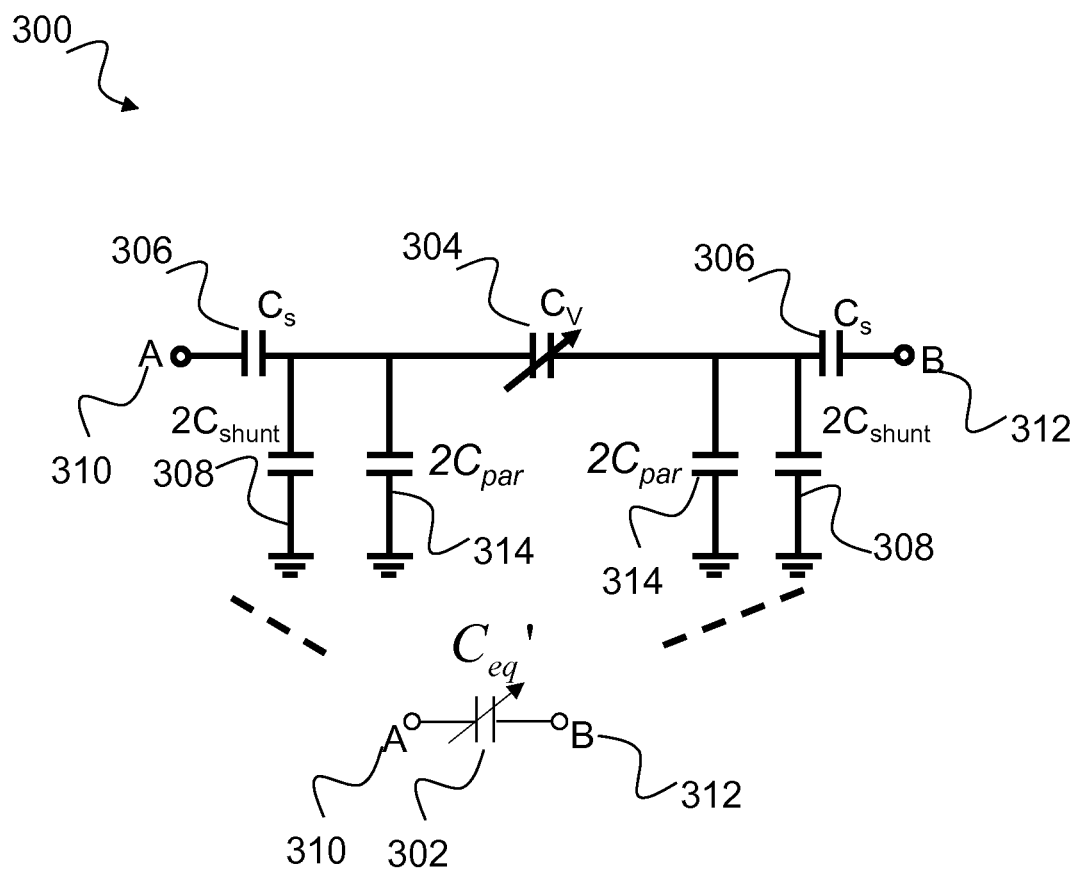
FIG. 3 illustrates a simplified representation of a fine capacitor bank.

Referring to FIG. 3, a simplified representation of an example of a differential capacitor bank, for example as capable of being used in the frequency generation circuit 230 of FIG. 2, is illustrated. The simplified representation of the example differential capacitor bank 300 may be used for controlling a frequency characteristic of a circuit (such as a resonant frequency of a VCO circuit) by modifying the equivalent capacitance, $C_{eq}$, 302 of the example differential capacitor bank 300.

In FIG. 3, a first variable capacitive element, $C_v$, 304, comprising one or more capacitive elements, may be operably coupled between two series capacitive elements, $C_s$, 306. Further, shunt capacitors, 2Cshunt, 308 may be operably coupled in parallel between one of the series capacitive elements, $C_s$, 306 and ground, either side of the first variable capacitive element, $C_v$, 304. The equivalent capacitance, $C_{eq}$, 302 of the simplified representation of the example differential capacitor bank 300 is illustrated in equation 1, with $Cf=C_{shunt}+C_{parasitic}$.

$$C_{eq} = \frac{C_s(C_v + C_f)}{2(C_v + C_f) + C_s} \quad \text{Equation 1}$$

Any change on the equivalent capacitance 302, located between input 'A' 310 and output 'B' 312 when one or more capacitive elements within the first variable capacitive element, $C_v$, 304 is/are enabled, is illustrated in equation 2.

$$\Delta C_{eq} = \frac{C_s^2}{(2C_v + 2C_f + C_s)^2} \times \Delta C_v \quad \text{Equation 2}$$

However, the inventors have recognised and appreciated that at MMW frequencies, associated parasitic capacitances, $2C_{par}$, 314 of the one or more enabled capacitive elements within the first variable capacitive element, $C_v$, 304 effectively add to the shunt capacitances, $2C_{shunt}$, 308, which in some instances may affect a resultant oscillation frequency of a corresponding VCO.

Therefore, in order to quantify this effect, let us assign 'N' to represent the total number of capacitive elements that can be enabled in the first variable capacitive element, $C_v$, 304, and 'm' to represent the number of enabled capacitive elements in the first variable capacitive element, $C_v$, 304. Hence, 'N−m' represents the number of disabled capacitive elements within the first variable capacitive element, $C_v$, 304. Thus, the generated variable capacitive element, $C_v$, 304 may be illustrated in equation 3.

$$Cv = [(N-m) \cdot Cv_{OFF} + m \cdot Cv_{ON}] \quad \text{Equation 3}$$

The generated parasitic capacitance, $2C_{par}$, is assumed to be a fraction of variable capacitive element, $C_v$, 304, and in some examples may be assumed to be of the order of: $2C_{par} = 0.1*Cv$.

Further to determining variable capacitive element, $C_v$, 304, from equation 3, and taking into account the generated associated parasitic capacitance, 2Cpar, 314, by replacing $C_f$ in equation 1 by $C_f' = C_f + C_{par}$, the equivalent capacitance, $C_{eq'}$, 302 may be determined as illustrated in equation 4.

$$C_{eq}' = \frac{C_s[(N-m)C_{vON} + mC_{vOFF} + C_f']}{2[(N-m)C_{vON} + mC_{OFF} + C_f'] + C_s} \quad \text{Equation 4}$$

Furthermore, any change to the equivalent capacitance, $\Delta C_{eq}'/\Delta m$, taking into account the parasitic capacitance, $2C_{par}$, 314, and the number of enabled capacitive elements, m, can be illustrated by equation 5. For a mathematical simplification, one can define $A = C_{on}/C_{off}$, or the ratio between a capacitance value '$C_{on}$' of the number of enabled capacitive elements, m, and a capacitance with the capacitance value '$C_{off}$' of the number of disabled capacitive elements, N−m. Also, for the same simplification purpose, a 'B' term may be defined as B=A−1.

$$\frac{\Delta C_{eq}'}{\Delta m} = \frac{BCv_{OFF}C_s^2}{(2mBCv_{OFF} + 2NCv_{OFF} + 2C_f' + C_s)^2} \quad \text{Equation 5}$$

Therefore, a greater number of enabled capacitive elements, 'm', within the first variable capacitive element, $C_v$, 304 may effectively lower the step size, $\Delta C_{eq'}$, of the capacitor bank 300. In some instances, this may have an effect of altering the variation equivalent capacitance, $C_{eq'}$, 302, resulting in an undesired change in the frequency step of an associated VCO, for example.

In some examples, it may be beneficial to maintain a linear/constant step size of the equivalent capacitance from the capacitor bank 300. This may result in a constant, or near constant, frequency step of an associated VCO. This may have an advantage of allowing a predictable and uniform frequency step for a given number of enabled capacitive elements within the first variable capacitive element, $C_v$, 304.

Figure 4:
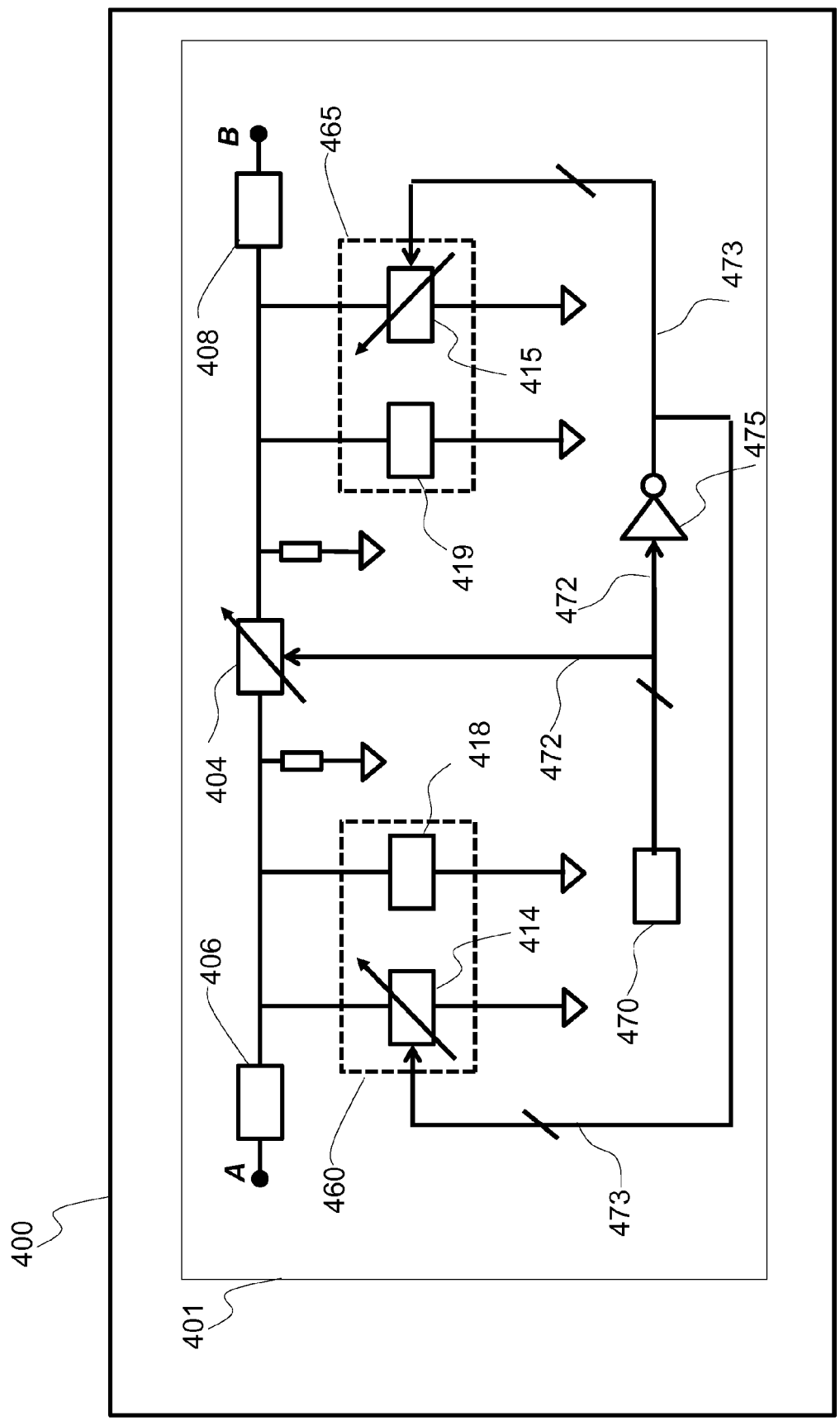
FIG. 4 illustrates an example of a modified capacitive divider bank.

Referring to FIG. 4, an example of a capacitive bank is illustrated. In this example, the capacitive bank 400 may be located within an integrated circuit 401, as illustrated. In this example, the capacitive bank 400 may be a fine capacitive bank, which may comprise a first variable capacitive bank 404 comprising one or more capacitive elements (not shown) and operably coupled between series input and output capacitive elements 406, 408. In one example, the first variable capacitive bank 404 may comprise a number of parallel coupled switchable capacitive elements (not shown). In some examples, the number of parallel coupled switchable capacitive elements may utilise a semiconductor switch, for example a bipolar device, in order to selectively enable and/or disable a number of the parallel coupled switchable capacitive elements. In some other examples, the first variable capacitive bank 404 may comprise a number of varactor devices.

In some examples, a first contact of a parallel coupled shunt capacitive element 418 may be operably coupled between the first variable capacitive bank 404 and the series capacitive element 406, and a second contact of the parallel coupled shunt capacitive element 418 may be operably coupled to ground. Further, in some examples, a second variable capacitive bank 414 may also have a first contact operably coupled in parallel between the first variable capacitive bank 404 and series input capacitive element 406, and a second contact operably coupled to ground. In some examples, the parallel coupled shunt capacitive element 418 and the second variable capacitive bank 414 may form a first compensation bank 460.

Further, in some examples, a first contact of a further parallel coupled shunt capacitive element 419 may be operably coupled between the first variable capacitive bank 404 and the series output capacitive element 408, and a second contact of the further parallel coupled shunt capacitive element 419 may be operably coupled to ground. Further, in some examples, a third variable capacitive bank 415 may also have a first contact operably coupled in parallel between the first variable capacitive bank 404 and series output capacitive element 408, and a second contact operably coupled to ground. In some examples, the further parallel coupled shunt capacitive element 419 and the third variable capacitive bank 415 may form a second compensation bank 465.

In some examples, the first compensation bank 460 and the second compensation bank 465 may have identical capacitive elements. In some examples, the first compensation bank 460 and the second compensation bank 465 may have slightly different capacitive elements, for example to better adjust a resonant frequency dependent upon, say a frequency drifting trend of the frequency generation circuit whilst in operation.

In some examples, second variable capacitive bank 414 and parallel coupled shunt capacitive element 418 (as well as third variable capacitive bank 415 and further parallel coupled shunt capacitive element 419) may be embedded in the same compensation bank.

In this example, a controller 470 may be operable to output a control signal 472 to the first variable capacitive bank 404. In some examples, the controller 470 may be located outside integrated circuit 401 or within the integrated circuit 401, as illustrated. In some examples, the control signal 472 may selectively enable a number of capacitive elements within the first variable capacitive bank 404. In some examples, the control signal 472 may be a control word, for example 'ctrl<N:0>'. The control word may be formed by 'N' parallel digital wires (or a parallel bus), with each bit being a determining signal to switch 'on'/'off' a respective capacitive element connected to this each digital wire. The control word may be generated by the digital controller 470.

The control signal 472 may, in some examples, be coupled to an inversion element 475, which may be operable to invert the control signal 472, and subsequently output an inverted control signal 473. In some examples, the inverted control signal 473 may be applied to the second variable capacitive bank 414 and the third variable capacitive bank 415.

In some examples, the first variable capacitive bank 404 may comprise a plurality of initially disabled and/or enabled parallel coupled capacitive elements. In this example, each of the plurality of parallel coupled capacitive elements may have an associated additional capacitance when each of the plurality of parallel coupled capacitive elements is enabled, for example an associated parasitic capacitance, as described with reference to FIG. 3. Therefore, in some examples, a number of capacitive elements within the first variable capacitive bank 404 may be selectively enabled, for example to provide a capacitance step of 'X', which may equate to a frequency step of 'Y' of an associated VCO. However, any associated parasitic capacitance generated when the number of capacitive elements within the first variable capacitive bank 404 are enabled, may affect the capacitance step, X, and associated frequency step, Y. This may result in an undesired step size, which may affect an associated frequency of a frequency synthesizer, for example.

In some examples, therefore, an associated compensation for the parasitic capacitance of each of the plurality of parallel coupled capacitive elements in the first variable capacitive bank 404, when enabled, may be respectively applied in the second variable capacitive bank 414 and/or the third variable capacitive bank 415. In this manner, the parallel coupled shunt capacitive element 418 is combined with the further parallel coupled shunt capacitive element 419.

In some examples, a parallel coupled capacitive element within the second variable capacitive bank 414 and/or the third variable capacitive bank 415 may represent a value of parasitic capacitance for an associated capacitive element within the first variable capacitive bank 404. For example, each capacitive element within the first variable capacitive bank 404 may have an associated capacitive element within the second variable capacitive bank 414 and/or the third variable capacitive bank 415, which may represent a parasitic capacitance value of the capacitive element within the first variable capacitive bank 404 when enabled. In some examples, an associated parasitic capacitance for a parallel coupled capacitive element may be split between the second variable capacitive bank 414 and the third variable capacitive bank 415.

In some examples, the control signal 472 may be operable to enable a controlled number of parallel coupled capacitive elements within the first variable capacitive bank 404. The subsequently inverted control signal 473 may be operable to disable a corresponding number of associated parallel coupled capacitive elements in the second variable capacitive bank 414 and/or the third variable capacitive bank 415 when the main capacitors or varactors in the first variable capacitive bank 404 are enabled. In these examples, the association between the enabled capacitive elements in the first variable capacitive bank 404 and the subsequently disabled capacitive elements in the second variable capacitive bank 414 and/or the third variable capacitive bank 415 may relate/correspond to the parasitic capacitance generated by the enabled capacitive elements in the first variable capacitive bank 404.

Therefore, in some examples, a number of parallel coupled capacitive elements may be enabled in the first variable capacitive bank 404, which may equate to a total capacitance of X, with an associated parasitic capacitance of Y. Disabling a corresponding number of capacitive elements within the second variable capacitive bank 414 and/or the third variable capacitive bank 415, which correspond to the parasitic capacitance Y, may allow the example differential capacitive bank 400 to compensate for generated parasitic capacitance. This may further increase the accuracy of the example differential capacitive bank 400 when aiding in determining and adjusting to a centre (resonant) frequency of oscillation.

Further, compensating for parasitic capacitance of enabled capacitive elements within the first variable capacitive bank 404 by disabling associated capacitive elements within the second variable capacitive bank 414 and/or the third variable capacitive bank 415, may provide a constant, or near constant, frequency step to an associated VCO. Therefore, in some examples, the frequency step and/or capacitance step may be kept constant, or near constant, which may improve linearity of an associated VCO.

In some examples, by receiving an inverted control signal 473, the second variable capacitive bank 414 and/or the third variable capacitive bank 415 may be operable to compensate for a parasitic capacitance by accordingly switching out, i.e. disabling, one or more identified capacitive elements. The one or more identified capacitive elements that is/are switched out may be proportional to the number of enabled capacitive elements within the first variable capacitive bank 404.

In some examples, the first variable capacitive bank 404, the second variable capacitive bank 414 and the third variable capacitive bank 415 may be one of a binary weighted or thermometric controlled bank of parallel coupled capacitive elements.

Further, the second variable capacitive bank 414 and the third variable capacitive bank 415 may comprise, for example, switched capacitor devices, switched varactor devices, or a combination of both. In some examples, the switching means may be one or more semiconductor device(s), for example a bipolar switch.

In some examples, disabling at least one capacitive element that may correspond to a parasitic capacitance of a further enabled capacitive element, may allow the total shunt capacitance of the first compensation bank 460 and the second compensation bank 465 to remain constant and/or balanced. Therefore, any number of enabled parallel coupled capacitive elements within the first variable capacitive bank 404 may not adversely affect the total shunt capacitance within the first compensation bank 460 and the second compensation bank 465.

Therefore, in some examples, a constant capacitive step, and therefore a resultant constant frequency step, may be achieved whilst switching (enabling/disabling) a number of parallel coupled capacitive elements within the first variable capacitive bank 404.

Furthermore, disabling a number of capacitive elements within the second and third variable capacitive banks 414, 415 that equal a total parasitic capacitance value when capacitive elements within the first variable capacitive bank 404 may be enabled, may allow parallel coupled shunt capacitive elements 418, 419 to be kept constant, regardless of the number of capacitive elements within the first variable capacitive bank 404 that are enabled or disabled.

In some examples, an associated parasitic capacitance that may be compensated for may be around 10% of an associated enabled capacitive element's capacitance value from the first variable capacitive bank 404.

Figure 5:
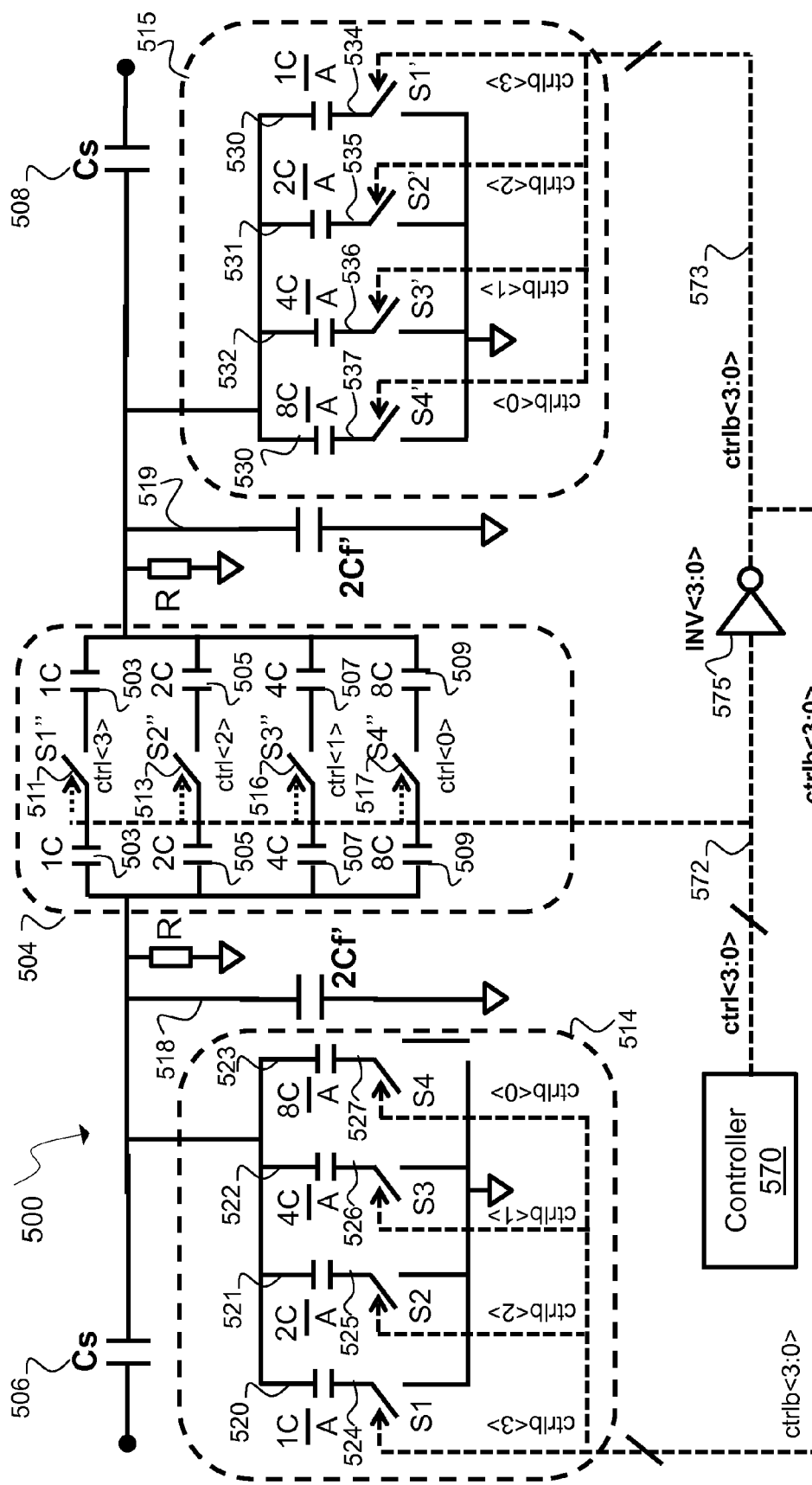
FIG. 5 illustrates an example of a further modified capacitive divider bank.

Referring to FIG. 5, a further example of a selectable capacitive bank 500 for example to be employed with a VCO, is illustrated. In some examples, a first variable capacitive bank 504 may be operably coupled in series between series input capacitive elements 506 and output capacitive elements 508. Further, a first contact of a parallel coupled shunt capacitive element 518 may be operably coupled between the first variable capacitive bank 504 and the series input capacitive element 506, and a second contact of the parallel coupled shunt capacitive element 518 may be operably coupled to ground.

Furthermore, in some examples, a second variable capacitive bank 514 may also have a first contact operably coupled in parallel between the first capacitive bank 504 and series capacitive element 506, and a second contact operably coupled to ground.

In some examples, a first contact of a further parallel coupled shunt capacitive element 519 may be operably coupled between the first variable capacitive bank 504 and the series output capacitive element 508, and a second contact of the parallel coupled shunt capacitive element 519 may be operably coupled to ground. Further, in some examples, a third variable capacitive bank 515 may also have a first contact operably coupled in parallel between the first variable capacitive bank 504 and series capacitive element 508, and a second contact operably coupled to ground.

In this example, the first variable capacitive bank 504 may comprise a number of paired parallel coupled capacitive elements, 503, 505, 507, 509, wherein together the parallel coupled capacitive elements, 503, 505, 507, 509 form a binary weighted capacitive bank. In this example, each of the paired parallel coupled capacitive elements 503, 505, 507, 509 may comprise a switch 511, 513, 516, 517, operably coupled between each capacitive element of the pair of parallel coupled capacitive elements 503, 505, 507, 509.

In this example, each switch 511, 513, 516, 517 may be operable to receive a control signal 572 from controller 570. In some examples, each individual switch 511, 513, 516, 517 may be operable to receive a dedicated control signal, which in some examples may be a control word. Therefore, in this example, switch 511 may be operable to receive a control signal 'ctrl<3>', switch 513 may be operable to receive a control signal 'ctrl<2>', switch 516 may be operable to receive a control signal 'ctrl<1>', and switch 517 may be operable to receive a control signal 'ctrl<0>'. In some examples, the control signals may be utilised by the controller 570 to selectively enable and/or disable a number of the paired parallel coupled capacitive elements 503, 505, 507, 509, wherein control signal 572 output by the controller 570 may comprise some or all of the control signals 'ctrl<0>' to 'ctrl<3>'.

Further, in some examples, the second variable capacitive bank 514 may comprise a number of further parallel coupled capacitive elements, 520, 521, 522, 523, wherein each of the number of further parallel coupled capacitive elements 520, 521, 522, 523 may be operably coupled in series to one of switches 524, 525, 526, 527. In this example, each switch 524, 525, 526, 527 may be operable to receive an inverted control signal 573, via the control signal 572 being applied to the inverter 575. For example, switch 524 may be operable to receive inverted control signal 'ctrlb<3>', switch 525 may be operable to receive inverted control signal 'ctrlb<2>', switch 526 may be operable to receive inverted control signal 'ctrlb<1>', and switch 527 may be operable to receive inverted control signal 'ctrlb<0>'.

Furthermore, in some examples, the third variable capacitive bank 515 may comprise a number of further parallel coupled capacitive elements 530, 531, 532, 533, wherein each of the number of further parallel coupled capacitive elements 530, 531, 532, 533 may be operably coupled in series to one of switches 534, 535, 536, 537. In this example, each switch 534, 535, 536, 537 may also be operable to receive the inverted control signal 573, via the control signal 572 being applied to the inverter 575. For example, switch 534 may be operable to receive inverted control signal 'ctrlb<3>', switch 535 may be operable to receive inverted control signal 'ctrlb<2>', switch 536 may be operable to receive inverted control signal 'ctrlb<1>', and switch 537 may be operable to receive inverted control signal 'ctrlb<0>'.

In this example, the paired parallel coupled capacitive elements 503 may each comprise a unit capacitance of, say, '1C', resulting in a capacitance value of C/2. In some examples, when enabled via switch 511, a parasitic capacitance around 10% of the value of each of the unit capacitances '1C' may be output in parallel to parallel coupled shunt capacitive elements 518 and 519. In this example, the additional parasitic capacitance to be compensated for may be represented as 'A', where A=1/10%, inasmuch as a corresponding additional compensation capacitance may be added by disabling respective capacitive elements of '1C/A' 520, 530 functioning as shunt capacitances by enabling switches 524, 534. Therefore, if the paired parallel coupled capacitive elements 503 were enabled by switch 511 using control signal 572, for example 'ctrl<3>, a corresponding inverted control signal 573, for example 'ctrlb<3>' may be received by switches 524, 534. As a result, capacitive elements 520, 530, each of capacitance value '1C/A' may be disabled, wherein the disabled capacitance value of capacitive elements 520, 530 may equal the parasitic capacitance output by the enabled paired parallel coupled capacitive elements 503.

A similar operation may be performed for the other combinations of paired parallel coupled capacitive elements 505, 507, 509 and associated capacitive elements 525, 526, 527, 535, 536, 537.

Therefore, selectively enabling a number of the paired parallel coupled capacitive elements 503, 505, 507, 509, may not affect the total shunt capacitance value 518, 519, due to the second variable capacitive bank 514 and third variable capacitive bank 515 being selectively controlled to introduce capacitive compensation for any parasitic capacitance caused by selectively enabling one or more of the paired parallel coupled capacitive elements 503, 505, 507, 509.

As a result, a constant capacitance step and, therefore, constant frequency step may be maintained, whilst selectively varying the capacitance of the first variable capacitive bank 504. Therefore, a desired frequency of oscillation, for a VCO for example, with a constant frequency step, may be achieved.

In various examples relating to FIG. 5, switched capacitive elements have been illustrated within the first variable capacitive bank 504, second capacitive bank 514 and third variable capacitive bank 515. It should be noted that this is purely for illustrative purposed, and any other form for capacitive element may be utilised. For example, the switched capacitive elements may be replaced by switched varactor elements, such as varactor diodes. Furthermore, although four or eight capacitive elements are illustrated, other examples may employ different numbers of capacitive elements.

Thus, in some examples, compensating for an associated parasitic capacitance from the first variable capacitive bank 504, may provide a constant, or near constant, capacitance step of the selectable capacitive bank 500.

Figure 6:
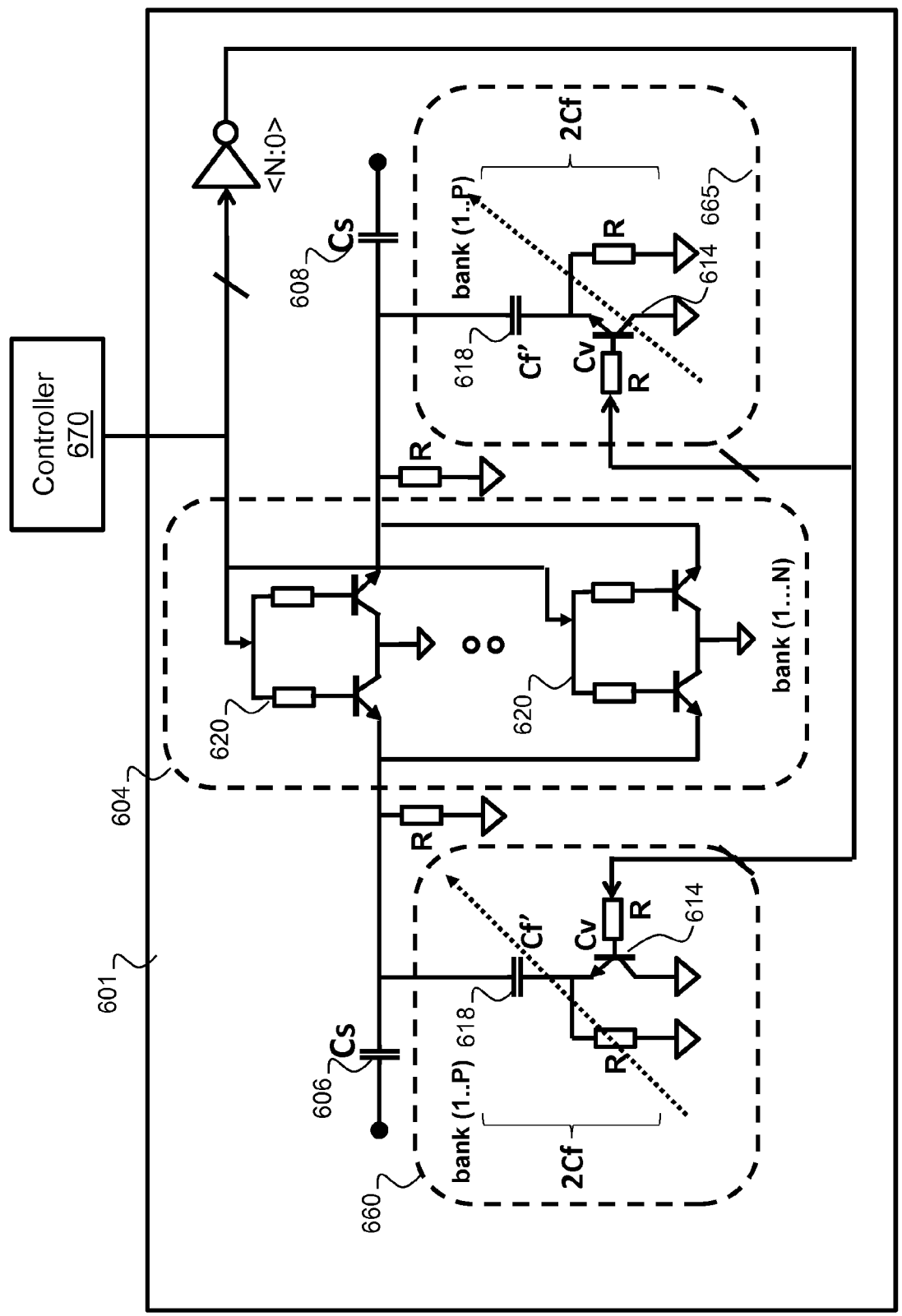
FIG. 6 illustrates an example of a yet further modified capacitive bank.

Referring to FIG. 6, a further example of a capacitive bank 600 is illustrated. In this example, the capacitive bank 600 may be located within an integrated circuit 601, as illustrated. In this example, a first variable capacitive bank 604 may be operably coupled in series between series capacitive element 606 and series capacitive element 608. Further, in some examples, a first contact of a parallel coupled hybrid shunt capacitive bank 660 may be operably coupled between the first variable capacitive bank 604 and the series input capacitive element 606, and a second contact of the parallel coupled hybrid shunt capacitive bank 660 may be coupled to ground. Resistor elements 602, 604, operably coupled in parallel on either side of the first variable capacitive bank 604, may be utilised to bias capacitive elements within the first variable capacitive bank 604.

In some examples, a first contact of a further parallel coupled hybrid shunt capacitive bank 665 may be operably coupled between the first variable capacitive bank 604 and the series output capacitive element 608, and a second contact of the parallel coupled hybrid shunt capacitive element 665 may be coupled to ground.

In this example, the first variable capacitive bank 604 may comprise a number of capacitive elements, for example, bipolar junction transistor (BJT) varactors 620.

Further, in this example, the parallel coupled hybrid shunt capacitive bank 660 and further parallel coupled hybrid shunt capacitive bank 665 may comprise a number of capacitive elements, for example, a number of single ended BJT varactors 614, with one shown for clarity, which may be operably coupled in series to a fixed shunt capacitive element 618.

In some examples, as shown, parallel coupled hybrid shunt capacitive bank 660 and parallel coupled hybrid shunt capacitive element 665 may be embedded in the same compensation bank, for example through the series association of single ended BJT varactors 614 and fixed shunt capacitive element 618. In this implementation specific case, the shunt bank is not divided, as this association performs the role of the fixed shunt and variable shunt banks (such as variable shunt banks 414, 418 of FIG. 4). Indeed, in the example embodiment in FIG. 6, control signals may be provided to the merged shunt capacitive bank 660, and the compensation of parasitic capacitance may be controlled by different control signal logic.

In some examples, a controller 670 may be located outside integrated circuit 601, as illustrated, or within the integrated circuit 601 as illustrated in FIG. 4.

Figure 7:
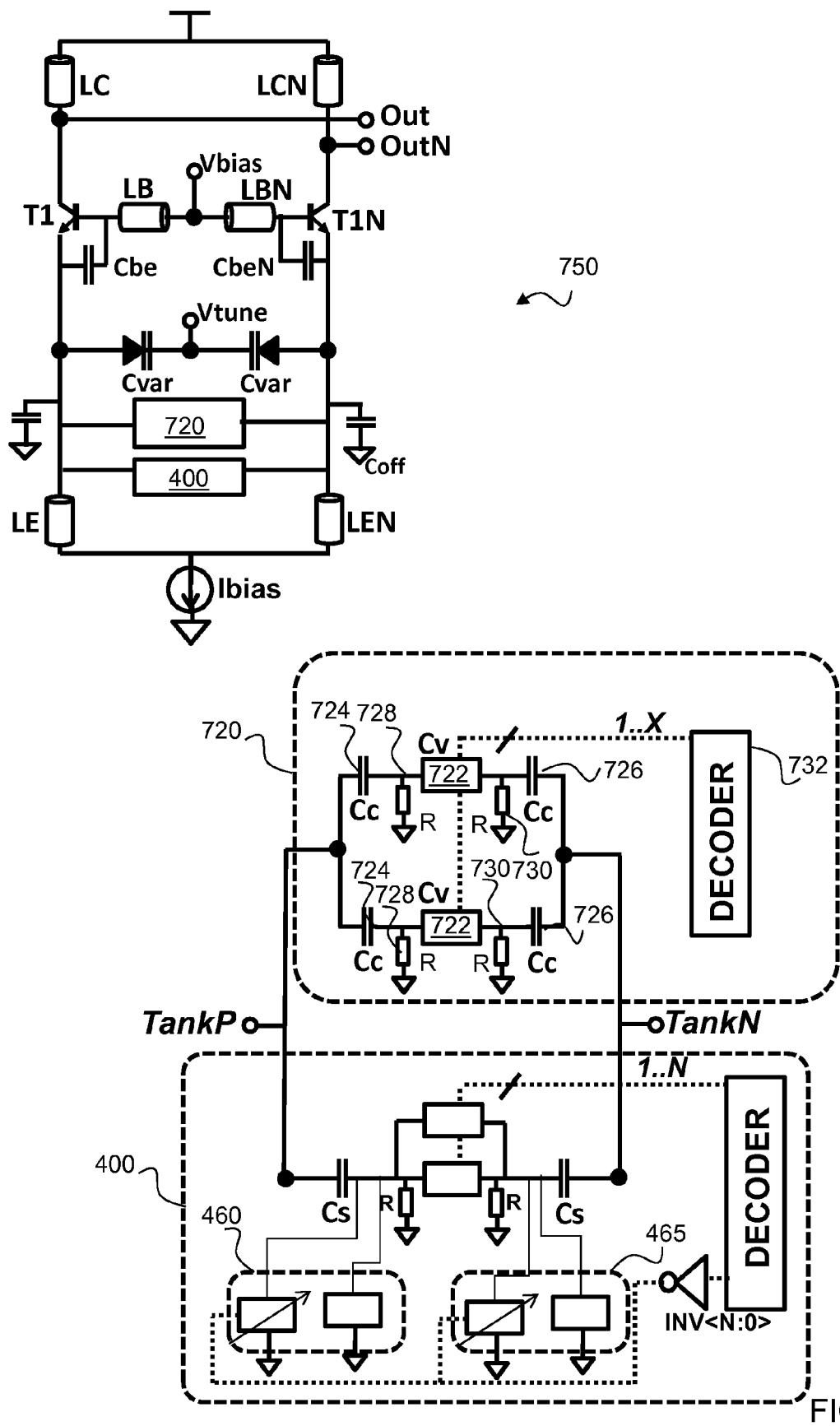
FIG. 7 illustrates an example of a modified fine capacitive divider bank implemented with a coarse capacitive bank inside a MMW VCO.

Referring to FIG. 7, a further example of capacitive bank of the capacitive bank 400 from FIG. 4 is illustrated. The further capacitive bank comprises a coarse capacitive bank 720, to illustrate an example of how the capacitive bank 400 may be implemented. In this example, the capacitive bank 400 may be utilised as a fine capacitive bank, in parallel with the coarse bank, 720.

In particular, FIG. 7 illustrates an example application of an MMW Colpitts VCO 750 incorporating both the fine capacitive bank 400 and the coarse capacitive bank 720.

In this example, the coarse capacitive bank 720 may comprise a number of parallel coupled capacitive elements, $C_v$, 722, situated between series capacitive elements 724, 726, $C_c$. Resistive elements 728, 730, located on either side of each of the parallel coupled capacitive elements 722, may be utilised to bias the parallel coupled capacitive elements 722 and series capacitive elements 724, 726.

The number of parallel coupled capacitive elements 722 may be selectively enabled or disabled based on a signal or digital word received from coarse capacitive bank decoder element 732.

In this example, the capacitance provided by the coarse capacitive bank 720 may be given by equation 6.

$$C_{Coarse} = \frac{Cc \cdot Cv}{(2Cv + Cc)} \qquad \text{Equation 6}$$

The coarse capacitance value provided by the coarse capacitive bank 720 may be complemented by the capacitor bank 400, in order to provide an accurate capacitance value and capacitance step to a VCO application, for example MMW Colpitts VCO 750.

Referring to the example application of an MMW Colpitts VCO 750, the coarse capacitive bank 720 and the capacitive bank 400 may be utilised together to provide a frequency tuning circuit to allow a centre frequency of the MMW Colpitts VCO 750 to be adjusted. In some examples, the capacitive bank 400 may be utilised with a built-in-self-test (GIST) technique, in order to compensate for the VCO centre frequency variation over various conditions, such as, for example, process and temperature conditions.

Utilising the capacitive bank 400 together with a re-centering technique may allow the centre frequency of the MMW Colpitts VCO 750 to be adjusted without the need for costly laser trimming, for example.

In some examples, utilising the capacitive bank 400 may provide a constant, or near constant, capacitance step and, therefore associated frequency step, to the MMW Colpitts VCO 750.

Figure 8:
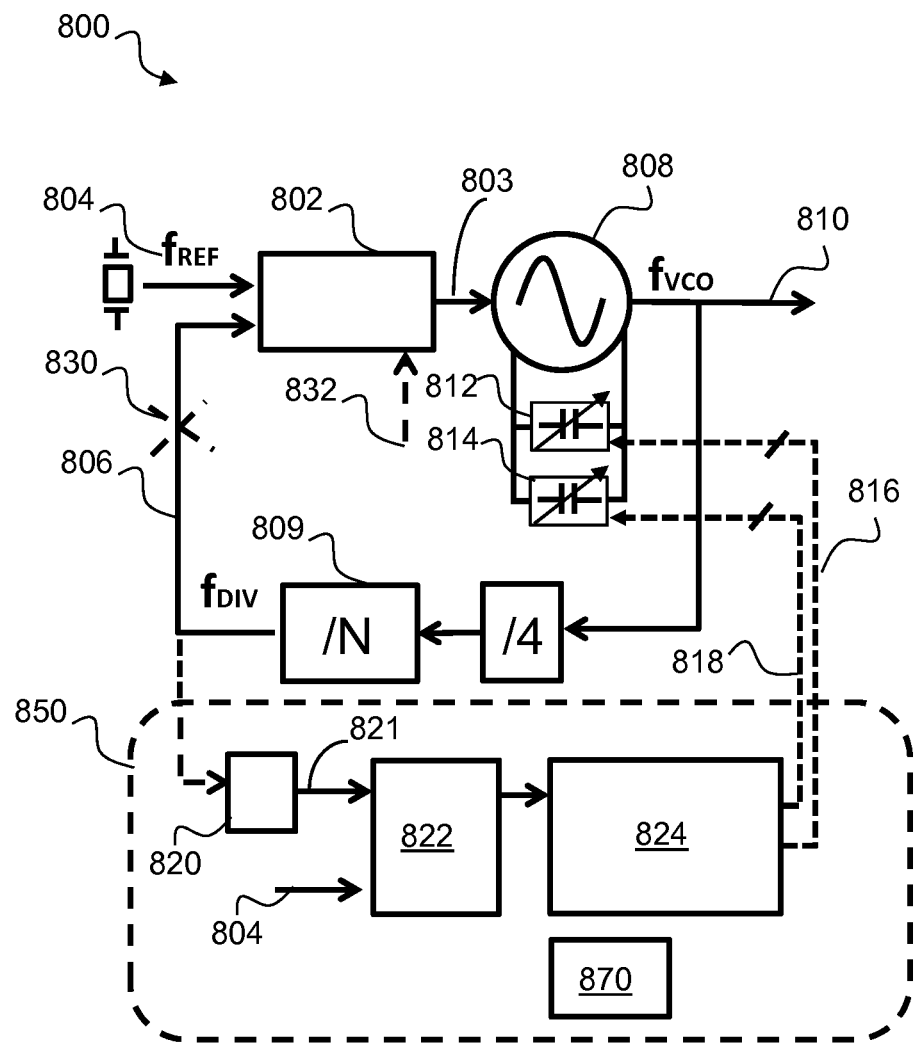
FIG. 8 illustrates an example of an open-loop calibration apparatus and VCO re-centering technique using coarse and modified fine capacitive banks.

Referring to FIG. 8, an example of an adapted phase locked loop (PLL) synthesizer 800, employing a centre frequency adjustment of a VCO according to example embodiments, is illustrated.

In this PLL example, a phase frequency detector 802, which may comprise exclusive OR (XOR) logic, receives a reference frequency 804, '$f_{ref}$', say from a crystal and feedback signal '$f_{div}$' 806 resulting from the divided output of a VCO 808. This divided output frequency value is given the division ratio (in this example N*4) that is set in the feedback loop. In some examples, this feedback loop may be implemented using a fixed divider (/4), and a fractional-N divider 809. The divided signal is then routed back to phase detector 802, as 806 signal. An output 803 from the phase frequency detector 802, together with a loop filter (not shown), form a voltage signal '$V_{tune}$', which is coupled to the VCO 808, wherein the VCO 808 is operable to output an oscillation frequency 810, which is a function of this $V_{tune}$ voltage value, as in any traditional PLL implementation.

In this adapted PLL synthesizer example 800, the output oscillation frequency 810 is not only dependent on $V_{tune}$ value, but also dependent upon a combination of capacitance values within a coarse capacitance bank 812 and a fine capacitance bank 814. In some examples, the coarse capacitance bank 812 and fine capacitance bank 814 may be controlled via control signals 816, 818 respectively, which are output by a digital controller 850. In some examples, the digital controller 850 may comprise a divide-by-D ('/D') element 820, which may be operable to output an '$f_{sense}$' signal 821 to a frequency comparison circuit 822. In some examples, the frequency comparison circuit 822 may be operable to output control signal(s) to a decoder circuit 824, wherein the decoder circuit 824 may be operable to provide control signals and/or control words to control the enabling/disabling of capacitive elements in the coarse capacitance bank 812 and/or the fine capacitance bank 814. In some examples, the control signals and/or control words 816 for controlling the enabling/disabling of capacitive elements in the coarse capacitance bank 812 and the control signals and/or control words 818 for controlling the enabling/disabling of capacitive elements in the fine capacitance bank 814 may be mutually exclusive.

In this example, the digital controller 850 may be only utilised in a calibration mode, wherein the feedback signal 'fdiv' 806 and the phase frequency detector 802 has been opened 830, resulting in an open loop. Therefore, in this example, the calibration mode may be utilised in an open loop calibration mode. For ease of understanding, elements that may be utilised during the open loop calibration mode have been illustrated with dashed lines.

In this example, once the feedback loop has been opened 830, a tuning voltage 832 may be used to force the frequency detector 802 output to a required value. In some examples, the required value may apply a middle value of, say, 2.5 from a tuning range of, for example, 0.5V to 4.5V. In some alternative examples, the forced voltage may be generated by an external dc signal source via a test pad (not shown), and a tester, or internally by a voltage regulator, dependent upon the application and voltage value to be generated. Furthermore, in some examples, the decoder circuit 824 may be operable to set a capacitance vale of the coarse capacitance bank 812 and the fine capacitance bank 814 to mid-capacitance range values.

The centre frequency of the VCO 808 is likely to be dependent upon the required application. However, for explanatory purposes, a centre frequency of say 76.5 GHz may be utilised in this example.

Therefore, in this example, when the loop is opened, and the re-centering method in a calibration mode is performed, a representation of the output oscillation frequency 810 may then be divided by '4' (for example using a fixed divider), further divided by a factor of 'N' by fractional-N divider 809, and again divided by another fixed divider 'D' 820, resulting in a divided oscillator signal 821 equal to fvco/(4*N*D). This divided oscillator signal 821 is compared, utilising frequency comparison circuit 822, to the reference clock 804, for example at, say 50 MHz, at a given $V_{tune}$ value. In order to equal the divided oscillator signal 821 and reference clock 804, at a given pre-forced $V_{tune}$ value, the value of 'N' can be calculated as 95.625 in this example.

If the divided representation 821 of the output oscillation frequency 810 is substantially equal to the reference clock 804, the VCO 808 may be operating at the desired centre frequency of 76.5 GHz. Otherwise, if the divided representation 821 of the output oscillation frequency 810 is not substantially equal to the reference clock 804, then the decoder circuit 824 may determine the difference and, if appropriate, adjust the control signals and/or control words 816 to (further) tune the coarse capacitance bank 812. In this manner, the controller may increase or decrease the total capacitance (by applying adjustments to the coarse capacitance bank 812) to the closest value of capacitance possible to the desired frequency of 76.5 GHz. In order to achieve this, the output oscillation frequency 810 may be compared with the reference clock 804, and the coarse capacitance bank 812 may be varied until a capacitance value is determined that provides the closest capacitance match to achieve a desired centre frequency of 76.5 GHz. Subsequently, the control signals and/or control words 816 may be stored, for example in a memory 870 situated within (or coupled to in other examples) the digital controller 850.

In this example, and once the determined coarse value is loaded, the decoder circuit 824 may then be arranged to adjust the control signals and/or control words 818 to the fine capacitance bank 814, and re-compare the output oscillation frequency 810 with the reference clock 804 in order to determine a capacitance value that provides a closest capacitance match to achieve a desired centre frequency of 76.5 GHz. Subsequently, the utilised control signals and/or control words 818 may be stored in memory 870.

In some examples, once control signals and/or control words for the coarse capacitance bank 812 and the fine capacitance bank 814 have been stored, the calibration procedure may be terminated and the closed loop feedback loop re-connected for the VCO 808 to operate normally.

In some examples, utilising the an adapted PLL synthesizer 800 may allow an accurate centre frequency of the VCO 808 to be achieved, which may increase performance of the VCO 808, for example in terms of tuning range and reduced phase noise.

Figure 9:
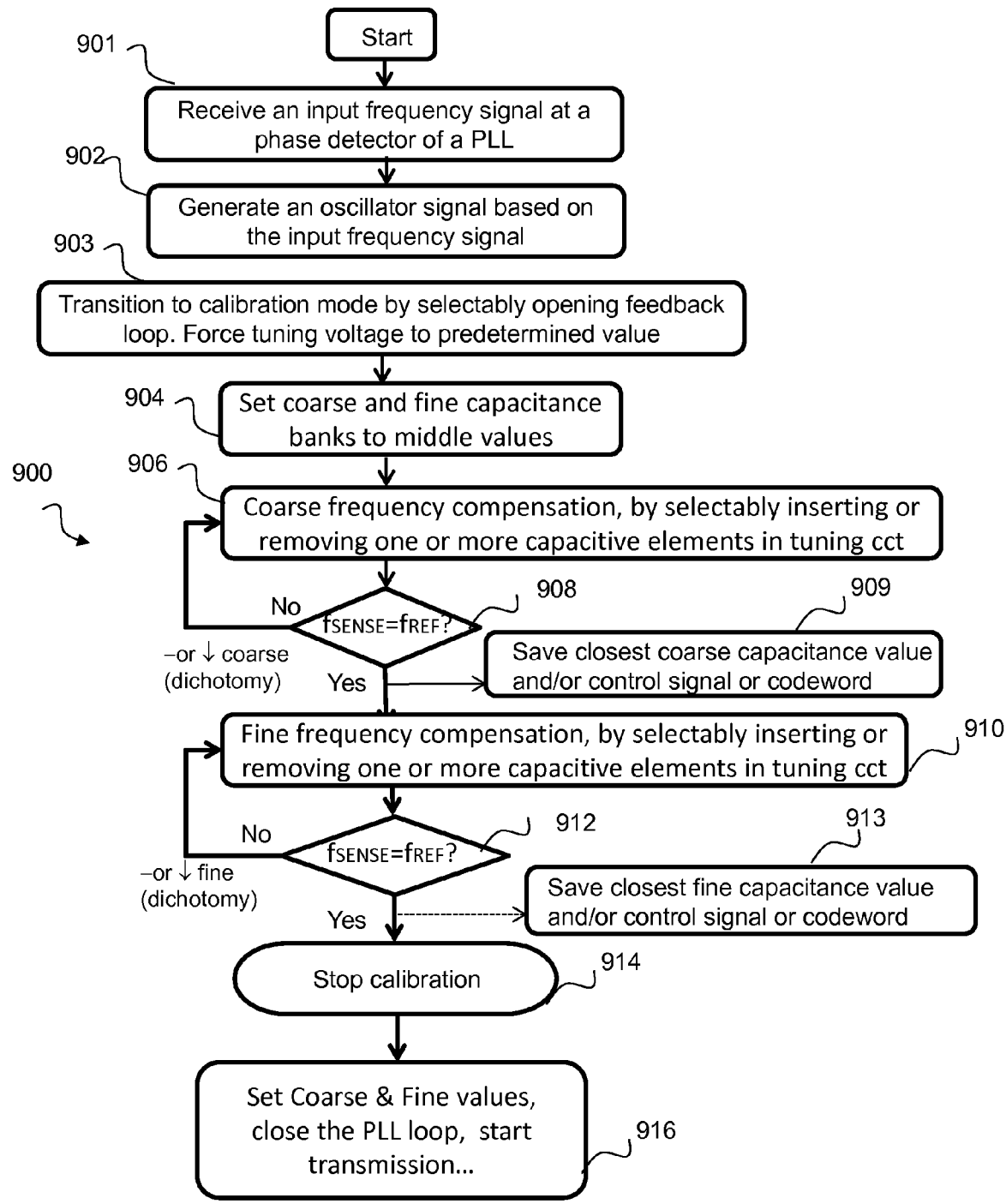
FIG. 9 illustrates a flow chart of the operation of the calibration apparatus from FIG. 8.

Referring to FIG. 9, a flowchart illustrates an example method for adjusting a frequency characteristic of a wireless device, say, adjusting the PLL of FIG. 8, using, say, the coarse and fine capacitive banks arrangement of any of FIGS. 4-7.

In one example, the wireless device comprises a frequency dependent circuit comprising an input node, an output node and a main bank of selectable first capacitive elements and at least one shunt bank of selectable second capacitive elements that affect a frequency characteristic of the frequency dependent circuit. The method of adjusting a frequency characteristic comprises: switching into the frequency dependent circuit a number of the selectable first capacitive elements; and switching out of the frequency dependent circuit at least one selectable second capacitive element based on the number of the selectable first capacitive elements switched into the frequency dependent circuit.

Initially, at 901, the example flowchart comprises receiving an input frequency signal at a phase detector of the phase locked loop circuit from a frequency source. At 902, an oscillator signal is generated based on the received frequency signal. At 903, a closed loop control connection between a VCO, for example VCO 808 from FIG. 8, and a phase frequency detector, for example phase frequency detector 802, may be selectably opened by a controller, for example digital controller 850 from FIG. 8. In this manner, the frequency detector may operate in an open loop calibration mode. Therefore, in this open loop calibration mode, the output of the VCO may not be able to influence the voltage response of the frequency detector, because this output is forced via input tuning voltage 832. Therefore, the input tuning voltage, $V_{tune}$, 832 of the VCO may be forced by the controller to a predetermined value, for example a median value within its tuning range. In this example, a median value of 2.5V may be chosen, with a tuning range of for example 0.5V to 4.5V.

At 904, a decoder circuit within the controller may be operable to set coarse and fine capacitance banks to their median capacitance values, for example coarse capacitance bank 812 and fine capacitance bank 814 from FIG. 8.

At 906, a VCO centre frequency may be determined, for example 76.5 GHz, for a given fixed, fractional 'N', and 'D' divider ratios. The decoder circuit then applies a control signal to set a capacitance of the coarse capacitance bank to coarsely tune the VCO centre frequency to (as close as possible) 76.5 GHz at the output of the VCO, e.g. performing coarse frequency tuning of the oscillator output signal. The coarse frequency tuning of the oscillator output signal may comprise selectably inserting or removing one or more capacitive elements in a coarse tuning capacitive circuit, prior to or during coarse frequency tuning, such as described in earlier FIG's.

At 908, the controller may compare a resultant output frequency, for example output frequency $f_{sense}$ 821 of FIG. 8, of the VCO utilising the capacitance value of the coarse capacitance bank with a reference clock, fref. In some examples, the reference clock may be a 50 MHz signal. If it is determined that the resultant output frequency (following a division by feedback loop plus calibration dividers) from the VCO is not equal to the reference clock, the controller may return to 906 and adjust the capacitance value of the coarse capacitance bank, in order to obtain a better match to the centre frequency of, say, 76.5 GHz, and repeat 906. The coarse frequency tuning of the oscillator output signal may comprise adjusting frequency dependent components such as varactors and/or selectably inserting or removing one or more capacitive elements in a coarse tuning capacitive circuit during coarse frequency tuning, such as described in earlier FIG's.

If it is determined at 908 that the output frequency or the adjusted resultant output frequency from the VCO is equal to, or as close as is possible to, the reference clock, the controller may transition to 910, and load (or set, or select) the coarse value found, to make the fine variation around the best coarse value found.

In some examples, the controller may, at 909, save to memory the coarse capacitance (and or control value and/or codeword) that provided the closest match to the desired centre frequency output by the VCO.

Subsequently, at 910, the controller may perform a similar procedure for the fine capacitance bank to that carried out at 906 for the coarse capacitance bank. Therefore, once a coarse capacitance value or set of values has been determined, a further capacitance value may be determined for the fine capacitance bank. The fine frequency tuning of the oscillator output signal may comprise selectably inserting or removing one or more capacitive elements in a fine tuning capacitive circuit, prior to or during fine frequency tuning, such as described in earlier FIG's. In particular, in a fine frequency tuning of the oscillator output signal in a calibration mode of operation, the switching into the frequency dependent circuit comprises switching in a number of selectable first capacitive elements; and switching out of the frequency dependent circuit at least one selectable second capacitive element based on the number of the selectable first capacitive elements switched into the frequency dependent circuit. In some examples, the fine frequency tuning circuit of the frequency dependent circuit comprises a main capacitive bank of selectable fine tuning capacitive elements; and at least one shunt bank of selectable second capacitive elements. In this manner, performing fine frequency tuning of the oscillator output signal may comprise applying a first control signal comprising a control word to the main capacitive bank of selectable fine tuning capacitive elements; and applying a second control signal comprising an inverted representation of the control word to the at least one shunt bank of selectable second capacitive elements, as illustrated in FIGS. 4-7.

Thus, an overall capacitance value based on both the coarse capacitance bank and fine capacitance bank may provide a centre frequency equal to, or as close as possible to, the centre frequency of 76.5 GHz. In this example, as the step size of the fine capacitance bank is smaller than that of the coarse capacitance bank, it may be possible to provide the VCO with a capacitance value to equal the desired centre frequency of 76.5 GHz, or provide a capacitance value to provide a closer match to the desired centre frequency of 76.5 GHz.

At 912, the controller may compare a new resultant output frequency, $f_{sense}$, of the VCO utilising the capacitance value of the fine capacitance bank with the reference clock. If it is determined that the resultant output frequency from the VCO is not equal to the reference clock, the controller may return to 910 and adjust the capacitance value of the fine capacitance bank, in order to obtain a better match to the desired centre frequency of 76.5 GHz. The fine frequency tuning may also comprise selectably inserting or removing one or more capacitive elements in a fine tuning capacitive circuit, prior to or during performing fine frequency tuning. In some examples, performing fine frequency tuning of the oscillator output signal may comprise applying a first control signal comprising a control word to a main capacitive bank of selectable fine tuning capacitive elements; and applying a second control signal comprising an inverted representation of the control word to at least one shunt bank of selectable second capacitive elements, as illustrated in FIGS. 4-7. The at least one selectable second capacitive element switched out of the oscillator may be configured to maintain a constant capacitance adjustment step that is independent of the number of the selectable first capacitive elements that are switched into the oscillator.

If it is determined that the output frequency from the VCO is now equal to, or as close as possible to, the reference clock, the controller may transition to 914.

In some examples, the controller may, at 913, save to memory the fine capacitance (and or control value and/or codeword) that provided the closest match to the desired centre frequency output by the VCO.

Subsequently, at 914, the controller may exit the calibration mode, and at 916, the controller may set the saved coarse and fine capacitance values from 909, 913 for the VCO, and re-enable the closed loop connection for normal VCO operation.

In some examples, applying a coarse tuning control signal for coarse frequency tuning may effect switching a number of selectable first capacitive elements in or out of the oscillator until a first minimum oscillator frequency error is determined; and fixing the coarse tuning capacitive circuit arrangement with the first minimum determined oscillator frequency error. In some examples, applying a fine tuning control signal may then comprise switching a number of selectable second capacitive elements in or out of the oscillator until a second minimum oscillator frequency error is determined; and fixing the fine tuning capacitive circuit arrangement with the second minimum determined oscillator frequency error.

In some examples, the open calibration mode may comprise setting a coarse tuning capacitive circuit and a fine tuning capacitive circuit to a mid-range capacitance value prior to commencing a calibration mode of operation.

In some examples, the example calibration method may be particularly useful in applications where a FMCW modulation is used, since this type of modulation technique occurs directly in the divided path. In some examples, this may be employed, through a ramp generation inside the Fractional-N divider, and modulate $V_{tune}$ port of the VCO. A well centred VCO, adjusted in this manner, may support a wide modulation range, for example as required by SRR and LRR devices.

Utilising some herein before described examples may improve the operating performance of the VCO, for example in terms of available tuning range and phase noise reduction.

In the forgoing specification, some examples may be utilised as a compensation technique to linearize capacitance and/or frequency steps, wherein these examples may be utilised with any kind of oscillation circuit. These examples may be utilised with one of: an LC based VCO, a ring oscillator, or a push-pull device.

Further, some examples may be utilised with any capacitance bank, for example comprising switched capacitors and/or varactor circuits. Furthermore, some examples may be utilised with any type of capacitance bank, for example: capacitor only banks, varactor only banks, combination of capacitor and varactor banks, wherein the varactors banks may comprise MOS or bipolar switching devices.

Although some examples have been implemented in a fine capacitive bank, this should not be seen as limiting. It is envisaged that some examples may apply equally to a coarse capacitive bank, for example.

Furthermore, although some examples have been implemented for MMW devices, this should not be seen as limiting. It is envisaged that some examples may be applied to applications in the frequency range of; 76-80 GHz—Radar, 60 GHz—WiFi™, 94 GHz—imaging, 20 Gbps/40 Gbps—clock and data recovery, for example.

Although some examples have been directed to positioning an oscillation frequency of a VCO, this again should not be seen as limiting. It is envisaged that as well as accurate VCO frequency positioning, some examples may also be applied to: digitally controlled oscillators within a digital synthesiser, for example in order to provide step linearity during modulation, or a VCO in an analog PLL synthesizer, for example in order to provide an accurate/constant frequency step.

In the foregoing specification, some examples have been described with reference to specific example embodiments. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Examples may be employed in an integrated circuit comprising a VCO or other frequency generation component or circuit. Alternatively, the examples may be implemented as any number of separate integrated circuits or separate devices interconnected with each other in a suitable manner, for example, where the VCO and the tuning circuit may be employed on different integrated circuits.

Also, the invention is not limited to physical devices or units implemented in non-programmable hardware but can also be applied in programmable devices or units with wireless capability and able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit for a wireless device, the integrated circuit comprising a frequency dependent circuit comprising:
   an input node;
   an output node;
   a main bank of selectable first capacitive elements that affect a frequency characteristic of the frequency dependent circuit;
   a first shunt bank of selectable second capacitive elements located between ground and the input node;
   a second shunt bank of selectable second capacitive elements located between ground and the output node;
   a phase locked loop comprising a phase frequency detector and a voltage controlled oscillator, an output of phase frequency detector coupled to an input of the voltage controlled oscillator, wherein the input node defines an input of the voltage controlled oscillator and the output node defines an output of the voltage controlled oscillator, and wherein the phase frequency detector is coupled to receive a reference frequency and is coupled to a divided frequency output of the voltage controlled oscillator with a switch; and a controller configured to:
apply a tuning voltage to the phase frequency detector;
control the switch to open a loop of the phase locked loop; and
subsequent to opening the loop of the phase locked loop, selectively enable or disable at least one selectable second capacitive element as a function of a number of the selectable first capacitive elements that are switched into the frequency dependent circuit.

2. The integrated circuit of claim 1, wherein the selectable second capacitive element(s) enabled or disabled are a function of a parasitic capacitance effect due to the number of the selectable first capacitive elements that are switched into the frequency dependent circuit.

3. The integrated circuit of claim 1, wherein the controller is arranged to switch out corresponding selectable second capacitive elements of the first shunt bank and second shunt bank of the frequency dependent circuit.

4. The integrated circuit of claim 3, wherein a capacitance value of a selected capacitive element from the first shunt bank of selectable second capacitive elements corresponds to a capacitance value of a selected second capacitive element from the second shunt bank of selectable second capacitive elements such that a combination of a total shunt capacitance of the first shunt bank of selectable second capacitive elements and second shunt bank of selectable second capacitive elements is substantially constant.

5. The integrated circuit of claim 1, wherein the controller is arranged to switch out at least one selectable second capacitive element to maintain a constant capacitance adjustment step independent of the number of the selectable first capacitive elements that are switched into the frequency dependent circuit.

6. The integrated circuit of claim 1, wherein the controller is operably coupled to the main bank of selectable first capacitive elements and configured to apply a first control signal to switch a number of the selectable first capacitive elements in or out of the frequency dependent circuit to affect the frequency characteristic of the frequency dependent circuit.

7. The integrated circuit of claim 1, wherein the controller is operably coupled to the first shunt bank and configured to apply a control signal to switch the selectable second capacitive elements in or out of the frequency dependent circuit.

8. The integrated circuit of claim 7, wherein the control signal comprises a control word and the controller is operably coupled to both the main bank of selectable first capacitive elements and the first shunt bank.

9. The integrated circuit of claim 1, wherein at least one from a group of: the main bank of selectable first capacitive elements, the first shunt bank, and the second shunt bank, comprises binary weighted capacitive banks or thermometric controlled capacitive banks.

10. The integrated circuit of claim 1, wherein the main bank of selectable first capacitive elements comprises a bank of coarse-tuning capacitor elements in parallel with a bank of fine-tuning capacitor elements.

11. The integrated circuit of claim 10, wherein a shunt bank switched into or out of the frequency dependent circuit corresponds to at least one capacitive element of the bank of fine-tuning capacitor elements being switched out of or into the frequency dependent circuit.

12. The integrated circuit of claim 1, wherein at least one from a group of: the main bank of selectable first capacitive elements, the first shunt bank, and the second shunt bank, comprises a plurality of varactors.

13. The integrated circuit of claim 12, wherein the plurality of varactors are formed from at least one of: bipolar junction transistor switched capacitances, metal oxide semiconductor based switched capacitances.

14. The integrated circuit of claim 1, wherein the frequency characteristic is a resonant frequency of the frequency dependent circuit.

15. The integrated circuit of claim 1, wherein the device is from a group of: a long range radar device, short range radar device, operating at millimeter waveform frequencies.

16. A wireless device, comprising a frequency dependent circuit comprising:
an input node;
an output node;
a main bank of selectable first capacitive elements that affect a frequency characteristic of the frequency dependent circuit;
a first shunt bank of selectable second capacitive elements located between ground and the input node;
a second shunt bank of selectable second capacitive elements located between ground and the output node;
a phase locked loop comprising a phase frequency detector and a voltage controlled oscillator, an output of phase frequency detector coupled to an input of the voltage controlled oscillator, wherein the input node defines an input of the voltage controlled oscillator and the output node defines an output of the voltage controlled oscillator, and wherein the phase frequency detector is coupled to receive a reference frequency and is coupled to a divided frequency output of the voltage controlled oscillator with a switch; and
a controller configured to:
apply a tuning voltage to the phase frequency detector;
control the switch to open a loop of the phase locked loop; and
subsequent to opening the loop of the phase locked loop, selectively enable or disable at least one selectable second capacitive element as a function of a number of the selectable first capacitive elements that are switched into the frequency dependent circuit.

* * * * *